United States Patent [19]
Danh et al.

[11] Patent Number: 5,983,907
[45] Date of Patent: Nov. 16, 1999

[54] METHOD OF DRYING SEMICONDUCTOR WAFERS USING HOT DEIONIZED WATER AND INFRARED DRYING

[75] Inventors: Jaclyn N. Danh, Portland, Oreg.; Masami Nakano, Vancouver, Wash.

[73] Assignee: SEH America, Inc., Vancouver, Wash.

[21] Appl. No.: 08/906,417

[22] Filed: Aug. 5, 1997

[51] Int. Cl.$^6$ ............... B02B 6/00; C25F 1/00; C25F 3/30; C25F 5/00
[52] U.S. Cl. .......... 134/1.3; 438/906; 134/1.2; 134/25.1; 134/25.4
[58] Field of Search ............ 438/906; 134/1.2, 134/1.3, 25.1, 25.4, 902

[56] References Cited

U.S. PATENT DOCUMENTS

| | | | |
|---|---|---|---|
| 4,663,820 | 5/1987 | Ionescu | 29/590 |
| 4,902,350 | 2/1994 | Steck | 134/1 |
| 4,977,688 | 12/1990 | Roberson et al. | 34/92 |
| 5,315,766 | 5/1994 | Roberson, Jr. et al. . | |
| 5,317,778 | 6/1994 | Kudo et al. . | |
| 5,776,296 | 7/1993 | Matthews | 156/345 |

FOREIGN PATENT DOCUMENTS

| | | |
|---|---|---|
| 0 428 784 B1 | 11/1989 | European Pat. Off. . |
| 0526245 | 2/1993 | European Pat. Off. . |
| 02 142129 | 5/1990 | Japan . |
| WO 95/08406 | 3/1995 | WIPO . |

OTHER PUBLICATIONS

Patent Abstracts of Japan, vol. 014, No. 387 (E–0967) Aug. 21, 1990.
The Evolution of Silicon Wafer Cleaning; Werner Kern; J. Electrochem. Soc., vol. 137, No. 6, Jun. 1990, The Electrochemical Society, Inc.
Dry Wafers Cleanly: Without Spinning; Kathy Skidmore; Semiconductor International; Jul. 1989.

*Primary Examiner*—John F. Niebling
*Assistant Examiner*—David A. Zarneke
*Attorney, Agent, or Firm*—Alston & Bird LLP

[57] ABSTRACT

Methods for drying semiconductor wafers following a chemical cleaning process utilize both a hot deionized water bath and medium-wavelength infrared light drying techniques. A preferred method comprises the steps of (a) maintaining a body of hot deionized water in a bath; (b) submerging multiple wafers to be dried in the body of hot deionized water in said bath; (c) slowly pushing said multiple wafers up through the surface of the body of hot deionized water in said bath; (d) providing an infrared bath containing an infrared lamp; and (e) transferring said multiple wafers to said infrared bath for drying.

10 Claims, 8 Drawing Sheets

Table 1: Hot DI Drying - Speed Combined

| Test # | Hot Rinse Temp [degree C] | Robot Speed [cm/min] | IR Dryers | | LPD | | | | |
| --- | --- | --- | --- | --- | --- | --- | --- | --- | --- |
| | | | Medium Light | Short Light | >0.13 | >0.16 | >0.2 | >0.3 | |
| 1 | 60 | 120 | on | on | 11.5<br>4.5<br>24 | 6.1<br>4.2<br>24 | 4.3<br>3.8<br>24 | 2.2<br>2.5<br>24 | X<br>SD<br>N |
| 2 | 60 | 120 | on | off | 12.4<br>9.7<br>25 | 7.0<br>7.5<br>25 | 3.6<br>3.8<br>25 | 1.4<br>1.6<br>25 | X<br>SD<br>N |
| 3 | 60 | 90 | on | off | 14.8<br>6.0<br>18 | 6.9<br>4.7<br>18 | 5.3<br>4.2<br>18 | 2.9<br>2.9<br>18 | X<br>SD<br>N |
| 4 | 60 | 60 | on | off | 11.1<br>4.7<br>38 | 5.4<br>3.6<br>38 | 3.3<br>2.4<br>38 | 2.1<br>2.0<br>38 | X<br>SD<br>N |
| 5 | 60 | 30 | on | off | 17.0<br>7.5<br>29 | 9.0<br>6.0<br>29 | 6.0<br>4.4<br>29 | 3.4<br>3.2<br>29 | X<br>SD<br>N |
| 6 | 60 | 15 | on | off | 28.1<br>13.3<br>18 | 17.3<br>10.7<br>18 | 12.4<br>6.3<br>18 | 6.8<br>3.3<br>18 | X<br>SD<br>N |

FIG. 9.

Table 1: Hot DI Drying - Temperature Test Results

| Test # | Hot Rinse Temp [degree C] | Robot Speed [cm/min] | IR Dryers Medium Light | LPD >0.13 | >0.16 | >0.2 | >0.3 | |
|---|---|---|---|---|---|---|---|---|
| 1 | 50 | 60 | on | 15.1<br>3.3<br>10 | 7.6<br>1.5<br>10 | 5.3<br>1.3<br>10 | 3.1<br>1.3<br>10 | X<br>SD<br>N |
| 2 | 50 | 90 | on | 17.9<br>6.5<br>9 | 7.0<br>2.6<br>9 | 3.9<br>2.2<br>9 | 3.1<br>1.6<br>9 | X<br>SD<br>N |
| 3 | 60 | 60 | on | 11.2<br>5.4<br>9 | 5.2<br>3.5<br>9 | 3.3<br>3.0<br>9 | 2.7<br>2.9<br>9 | X<br>SD<br>N |
| 4 | 60 | 90 | on | 17.4<br>5.8<br>10 | 8.9<br>4.7<br>10 | 6.9<br>4.1<br>10 | 4.0<br>3.0<br>10 | X<br>SD<br>N |
| 5 | 70 | 60 | on | 16.9<br>7.0<br>9 | 8.2<br>4.5<br>9 | 6.3<br>4.5<br>9 | 3.7<br>2.5<br>9 | X<br>SD<br>N |
| 6 | 70 | 90 | on | 11.2<br>5.4<br>10 | 5.8<br>4.4<br>10 | 4.3<br>4.1<br>10 | 2.9<br>3.3<br>10 | X<br>SD<br>N |
| 1 | 50 | 30 | on | 15.9<br>7.5<br>10 | 7.9<br>4.5<br>10 | 6.2<br>3.4<br>10 | 2.8<br>2.5<br>10 | X<br>SD<br>N |
| 2 | 50 | 15 | on | 23.0<br>12.6<br>10 | 9.8<br>8.5<br>10 | 6.8<br>6.3<br>10 | 2.9<br>2.9<br>10 | X<br>SD<br>N |
| 3 | 60 | 30 | on | 18.8<br>9.7<br>9 | 8.7<br>6.6<br>9 | 6.4<br>5.8<br>9 | 2.8<br>2.3<br>9 | X<br>SD<br>N |
| 4 | 60 | 15 | on | 25.0<br>12.2<br>10 | 13.7<br>9.6<br>10 | 9.9<br>6.0<br>10 | 4.6<br>4.3<br>10 | X<br>SD<br>N |
| 5 | 70 | 30 | on | 21.7<br>11.1<br>10 | 11.2<br>7.2<br>10 | 8.0<br>6.8<br>10 | 3.1<br>3.8<br>10 | X<br>SD<br>N |
| 6 | 70 | 15 | on | 37.4<br>11.2<br>10 | 19.0<br>6.9<br>10 | 12.8<br>5.3<br>10 | 3.2<br>2.2<br>10 | X<br>SD<br>N |

FIG. 11.

METHOD OF DRYING SEMICONDUCTOR WAFERS USING HOT DEIONIZED WATER AND INFRARED DRYING

BACKGROUND OF THE INVENTION

1. Area of the Art

The invention relates generally to methods of rinsing and drying wafers in semiconductor processing, and specifically to methods of drying wafers using hot deionized (DI) water in conjunction with infrared (IR) drying techniques.

2. Description of the Prior Art

The manufacture of semiconductor wafers used for device manufacturing requires several mechanical and/or chemical processes, typically followed by chemical cleaning of the wafers to remove particle contaminants from the wafer surface. Both particle size (measured in micrometers) and particle frequency are measured, with technology continually striving to reduce both size and frequency. The present state of the art calls for a combination of chemicals and ultrasonic or megasonic energy to remove the particles.

Upon completion of the cleaning step, the wafers must be dried. One common method employs a spin dryer. These dryers are basically centrifuges that throw water from both the wafers and cassettes that contain them. This method of drying induces a high stress on the wafers, which can lead to structural failure of the wafer. It can also deposit small particles on the wafer generated by the motion of the dryer.

Another common method of drying wafers is solvent vapor drying, with isopropyl alcohol (IPA) being the typical solvent used. This method improves upon the spin drying method by eliminating the high stress induced by the centrifuge, and produces a more particle-free wafer, providing a high quality solvent is used. However, this method produces other drawbacks. Most notably, copious quantities of solvent are required, and disposing of the solvent waste is both expensive and detrimental to the environment. Further, the handling mechanisms and the deionized (DI) water quality used in the cleaning system must be maintained with extreme fastidiousness. Any contaminations in the water or on the handling mechanisms are readily transferred to the wafers and distributed across the wafer surface by the solvent.

A relatively new technique is capillary drying, requiring only hot DI water. The wafers are extracted out of a hot DI water bath at a slow rate. For optimal particle control, current art such as U.S. Pat. No. 4,902,350 suggests that water temperature should be between 80° and 85° C., with the wafers being extracted from the DI bath at a pull rate of between 2.5 and 10 centimeters per minute.

Another relatively new technique uses infrared (IR) drying. This technique typically employs a medium-wavelength IR (wavelength of approximately 2.6 microns) heater and a short-wavelength IR (wavelength approximately 1.2 microns) heater for drying the surfaces of the wafer. The short-wavelength IR heater must be aimed directly at the surface of the wafer, and therefore can only dry one wafer at a time. Thus, productivity is severely limited.

SUMMARY OF THE INVENTION

It is an object of the present invention to provide novel methods of drying wafers with improved productivity and reduced particle frequency and size.

These and other objects and advantages are achieved by combining improvements to hot DI water and IR drying techniques. In accordance with the present invention, a method for drying silicon wafers from a chemical cleaning process comprises the steps of (a) maintaining a body of hot deionized water contained in a bath; (b) submerging multiple wafers to be dried in the body of hot deionized water; (c) slowly pushing said multiple wafers up through the surface of the body of hot, deionized water in said bath; (d) providing an infrared bath containing an infrared lamp; and (e) transferring said multiple wafers to said infrared bath for drying.

Such an arrangement has been found to provide a number of advantages. As explained in greater detail below, it has been found that by combining improvements to hot DI water and IR drying techniques, the methods in accordance with the present invention use medium-wavelength IR only, eliminating the shortwavelength IR. This allows batches of wafers to be dried simultaneously rather than individually. In addition, when used in conjunction with hot DI water drying, the added heat from the medium wavelength IR allows the pull speed from the hot DI water bath to increase to between 60 and 100 centimeters per minute, while lowering the DI bath temperature to between 50° and 70° C. The overall result is a significant improvement in productivity, as compared with each individual method, while maintaining similar particle frequencies and sizes. Furthermore, this invention also eliminates the use of cassettes (wafer carriers) in the process. Since the cassettes are not used in methods according to the invention, productivity is improved by not having to dry the cassettes. Also, since cassettes do not enter the cleaning baths, the baths stay cleaner by not introducing additional particles into the cleaning solutions. Rather, the cassettes themselves can be cleaned off-line as needed.

The invention is defined in its fullest scope in the appended claims and is described below in its preferred embodiments.

DESCRIPTION OF THE FIGURES

The above-mentioned and other features of this invention and the manner of obtaining them will become more apparent, and will be best understood by reference to the following description, taken in conjunction with the accompanying drawings. These drawings depict only a typical embodiment of the invention and do not therefore limit its scope. They serve to add specificity and detail, in which:

FIG. 9 is a table demonstrating the relationship between lifting rate and particle frequency and size.

FIG. 11 is a table demonstrating the relationship between DI water temperature and lifting rate.

DETAILED DESCRIPTION OF THE INVENTION

The present invention provides methods for drying semiconductor wafers, such as silicon wafers, following a chemical cleaning process. In accordance with the invention, and following a chemical cleaning process, wafers are transferred to a hot DI water bath and then to an IR drying bath for drying.

Figure 1:
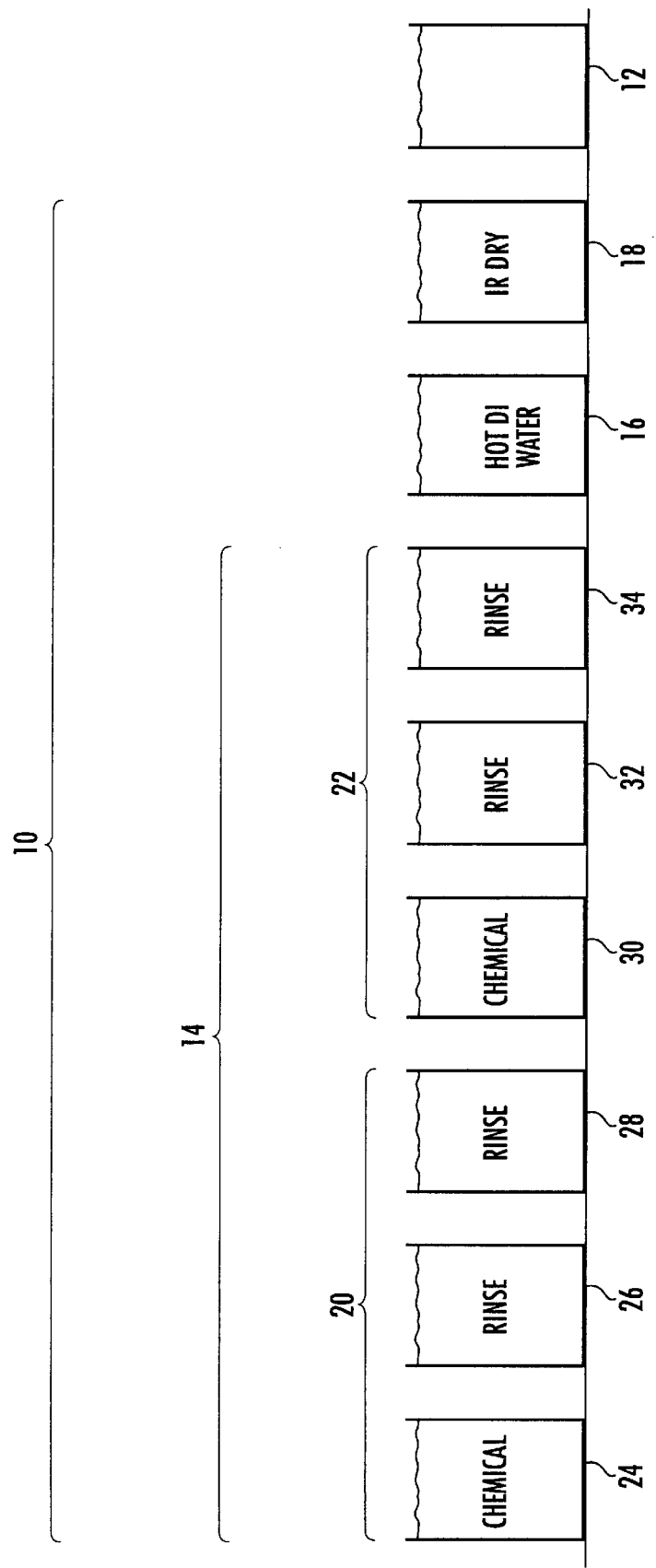
FIG. 1 is an illustrative process flow chart diagram showing multiple wafer processing in accordance with the present invention utilizing a hot deionized (DI) water bath and medium infrared (IR) drying procedures.

FIG. 1 shows a process flow diagram of a multiple wafer processing method of the present invention utilizing a hot de-ionized (DI) water bath and medium-wavelength infrared (IR) drying procedures. In a preferred embodiment of the present invention, a multiple wafer processing method 10 utilizes a multiplicity of processing procedures before the wafers are delivered to a loading device 12. The multiplicity of processing procedures of the multiple wafer processing method 10 include a chemical/rinse procedure 14, a hot deionized (DI) water bath procedure 16, and a medium-wavelength infrared (IR) drying bath procedure 18.

The chemical/rinse procedure 14 may include one or more chemical/rinse cycles. In this preferred embodiment, the chemical/rinse procedure 14 includes two (2) chemical/rinse cycles 20 and 22, each having a chemical bath followed by two (2) rinse baths. The first chemical/rinse cycle 20 includes a first chemical bath 24 followed by a first rinse bath 26 and a second rinse bath 28. The second chemical/rinse cycle 22 includes a second chemical bath 30 followed by a third rinse bath 32 and a fourth rinse bath 34. These chemical/rinse baths are conventional and will not be described further in detail here.

Figure 2:
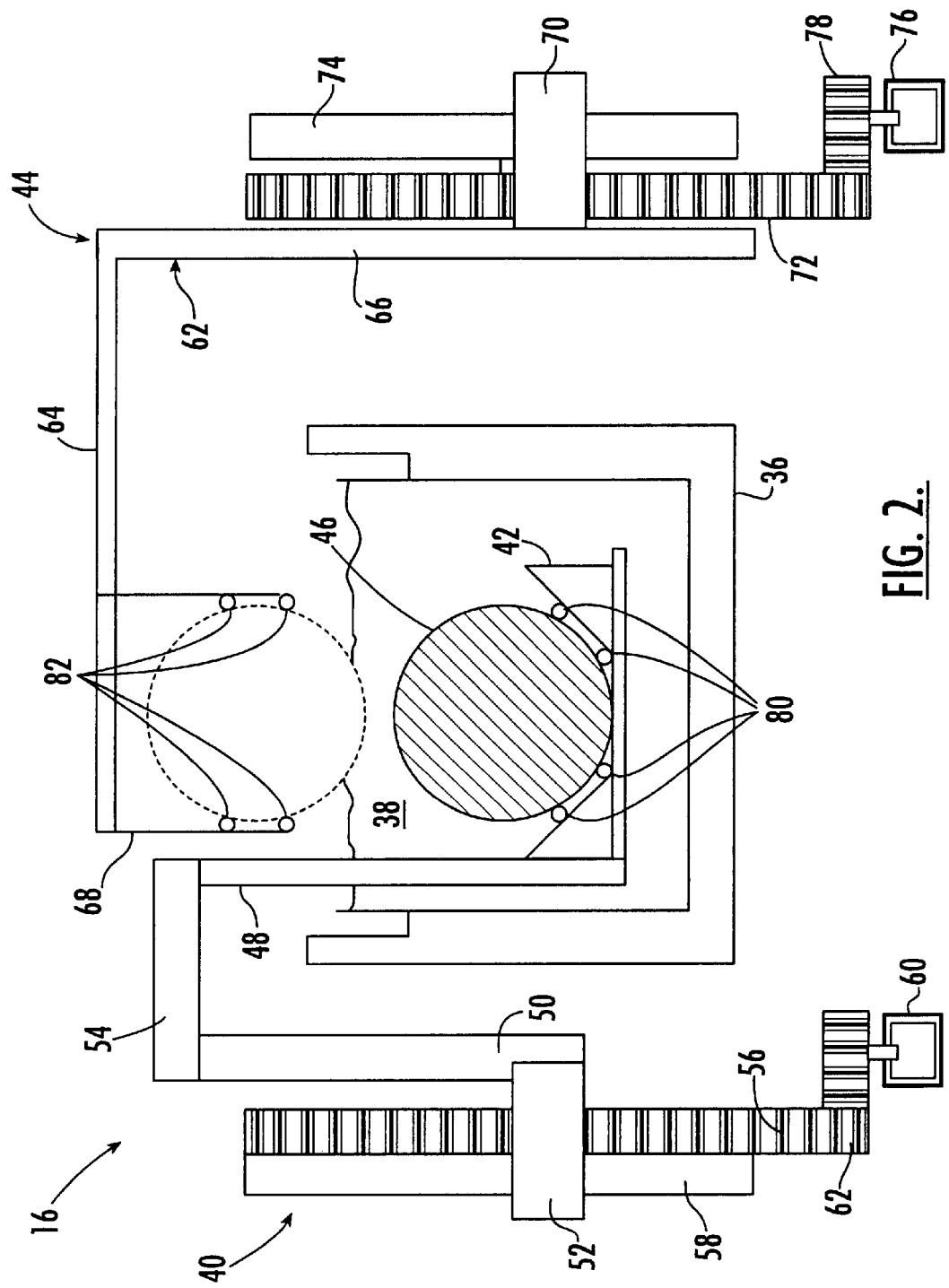
FIG. 2 is a schematic diagram showing a hot DI water bath utilized in the multiple wafer processing of the present invention.

FIG. 2 is a detailed example of the hot DI water bath 16 utilized in the multiple wafer processing method 10. The essential component parts of the hot DI water bath 16 include a tank 36 for containing a body of hot DI water 38, a first robot unit 40 for holding and lifting a wafer rack 42, and a second robot unit 44 for picking up and transporting multiple wafers 46.

Figure 3:
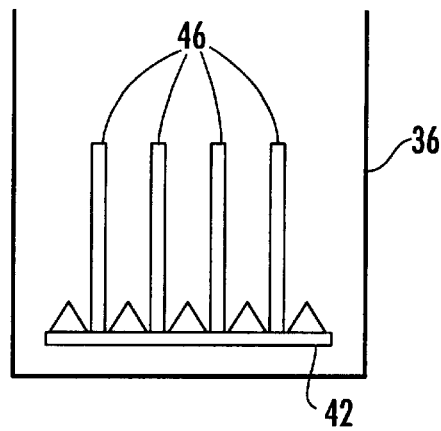
FIG. 3 is a schematic side view diagram showing the positioning of the multiple wafers in the hot DI water bath.

Referring to FIGS. 2 and 3, the multiple wafers 46 are received and held in the hot DI water bath tank 36 by the wafer rack 42. The wafers 46 are vertically oriented and positioned in parallel relationship to each other. The wafer rack 42 holds each wafer 46 at four (4) contacts 80. As an example, as many as 25 of the wafers 46 may be processed at one-time as a batch.

With this wafer rack arrangement, no conventional wafer cassettes need be used. This feature improves the productivity of the process by not having to dry the cassettes. In addition, since no cassette enters into the hot DI water bath, the bath is kept clean without the introduction of additional particles into the cleaning solution by the cassettes.

Referring again to FIG. 2, in this preferred embodiment the first robot unit 40 include a vertical inner arm 48 which is fixedly connected to the wafer rack 42, a vertical outer arm 50 which is connected to a sliding block 52, and a horizontal bridge arm 54 which securely interconnects the inner arm 48 and the outer arm 50. The sliding block 52 is threadably mounted on a ball screw 56, which is in turn mounted vertically and can rotate freely, such that the sliding block 52 can ascend or descend along the ball screw 56 as the ball screw 56 rotates. The ascending or descending motion of the sliding block 52 is further guided by a vertical shaft 58.

The ball screw 56 is rotatably driven by a first motor 60 through a gear assembly 62. Since rotation of the ball screw 56 causes the vertical movement of the sliding block 52, which in turn causes the vertical movement of the wafer rack 42 through the outer arm 50, the bridge arm 54 and the inner arm 48 of the first robot unit 40, the ascending or descending speed or rate of the wafer rack 42 is governed by the first motor 60. In other words, the first motor 60 controls the rate of pushing the wafers 46 up through the surface of the body of DI water 38.

The second robot unit 44 has a robot arm structure 62 which includes a horizontal member 64 and a vertical member 66. The distal end of horizontal member 64 of the robot arm structure 62 carries a clamp assembly 68 for picking up the wafers 46 when they are almost out of the hot DI water 38 and are leaving the tank 36. Each wafer 46 is held by the clamp assembly 68 at four (4) contacts 82. The lower portion of the vertical member 66 of the robot arm structure 62 is attached to a sliding block 70.

The sliding block 70 is threadably mounted on a ball screw 72, which is in turn mounted vertically and can rotate freely, such that the sliding block 70 can ascend or descend along the ball screw 72 as the ball screw 72 rotates. The ascending or descending motion of the sliding block 70 is further guided by a vertical shaft 74.

The ball screw 72 is rotatably driven by a second motor 76 through a gear assembly 78. Since rotation of the ball screw 72 causes the vertical movement of the sliding block 70, which in turn causes the vertical movement of the clamp assembly 68 through the robot arm structure 62 of the second robot unit 44, the ascending or descending of the clamp assembly 68 is controlled by the second motor 76.

Figure 4:
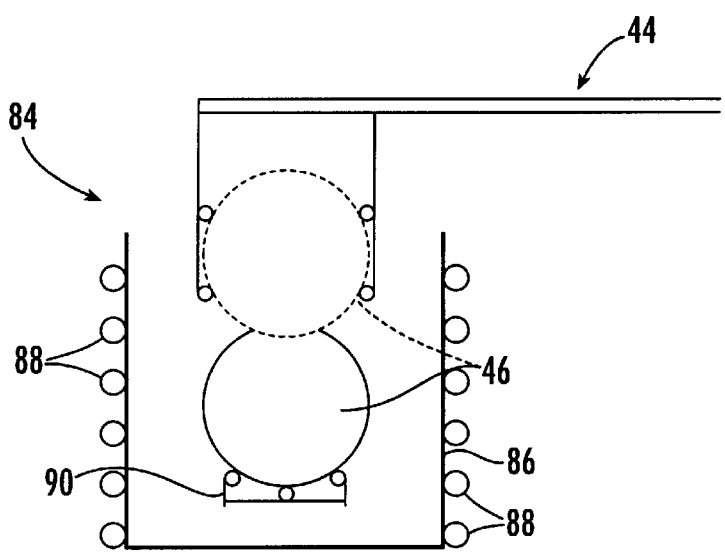
FIG. 4 is a schematic front view diagram showing the arrangement of a medium IR drying bath utilized in the multiple wafer processing of the present invention.
Figure 5:
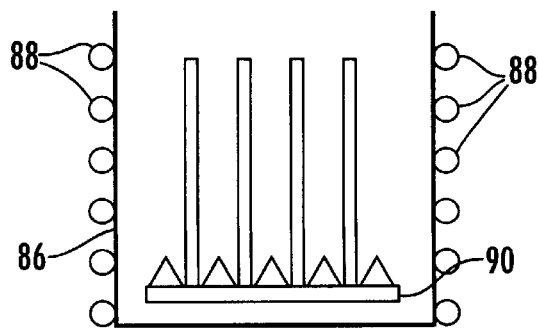
FIG. 5 is a schematic side view diagram showing the positioning of the multiple wafers in the medium IR drying bath.

After the wafers 46 are picked up by the second robot unit 44, they are transported into a medium-wavelength IR drying bath 84, as shown in FIG. 4. Referring to FIGS. 4 and 5, the essential component parts of the medium-wavelength IR drying bath 84 include a tank 86, a plurality of medium-wavelength IR lamps 88 mounted on all four (4) sidewalls of the tank 86, and a wafer rack 90 which may be similar to the wafer rack 42 of the hot DI water bath 16. The medium-wavelength IR drying bath 84 may further include a robot unit (not shown) for raising and lowering the wafer rack 90, which robot unit may be similar to the first robot unit 40 of the hot DI water bath 16.

Figure 6:
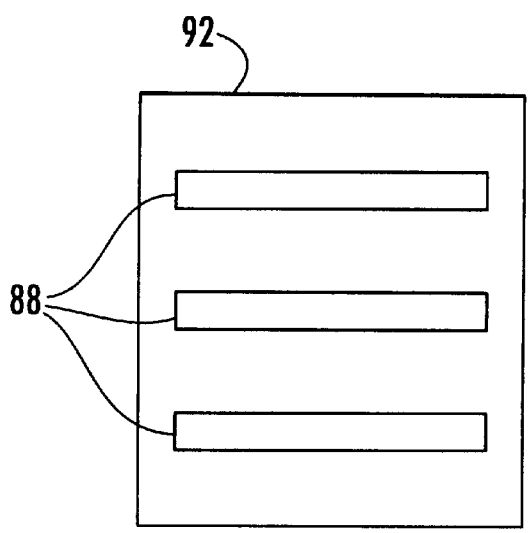
FIG. 6 is a schematic front view diagram showing the arrangement of one IR unit of the medium IR drying bath utilized in the multiple wafer processing of the present invention.
Figure 7:
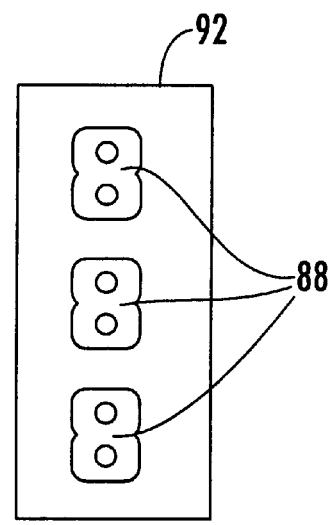
FIG. 7 is a schematic side view diagram showing the IR unit of the medium IR drying bath.

Preferably, the IR lamps 88 of the medium-wavelength IR drying bath 84 are grouped in a plurality of IR lamp units 92. Referring to FIGS. 6 and 7, each of the IR lamp units 92 may include three (3) IR lamps 88. The back sides of the IR lamps 88 are shielded so that the light only shines from the front thereof, toward the wafers. As an example, each IR lamps 88 may be 400 watts; therefore each IR lamp unit 92 may be 1,200 watts. The IR lamps 88 have a medium IR wavelength of approximately 2.6 microns (as compared to a short IR wavelength of approximately 1.2 microns).

It is to be understood that the form of the hot DI water bath and medium-wavelength IR drying bath depicted in the drawings have been chosen only for the purpose of describing a particular embodiment and function of the invention, and the material of the invention can be arranged in various ways and incorporated in other types of devices, all of which will be evident to those skilled in the art.

The present invention provides multiple wafer processing methods utilizing a hot DI water bath and a medium-wavelength IR drying bath. In accordance with the described embodiment of the present invention, after the wafers 46 pass through the chemical/rinse cycles, they are brought into the hot DI water bath 16. Thereafter, the wafers 46 are pushed up through the surface of the body of hot DI water 38 by the support plate 42 which is operated by the first robot unit 40. The lifting rate is controlled by the first motor 60. When the wafers 46 are almost out of the hot DI water 38, they are picked up by the second robot unit 44 which then transports the wafers 46 to the medium-wavelength IR drying bath 18, wherein the wafers 46 are further dried by the medium-wavelength IR lamps 88.

In a conventional drying bath, the rate of lifting the wafers from the drying bath takes place at a very slow rate, e.g., 2.5 to 10 cm/min., and the temperature of the bath is maintained at about 80–85° C. In the present invention, since the hot DI water bath is utilized in conjunction with the medium-wavelength IR drying bath, the added heat from the medium-wavelength IR drying bath allows the lifting rate of the wafers from the hot DI water bath to be increased to a much faster rate of about 20–120 cm/min, and the temperature of the DI water bath to be lowered to between 30° C. and 70° C. These features significantly improve the productivity of the process, while maintaining a high quality of processing result.

Figure 8:
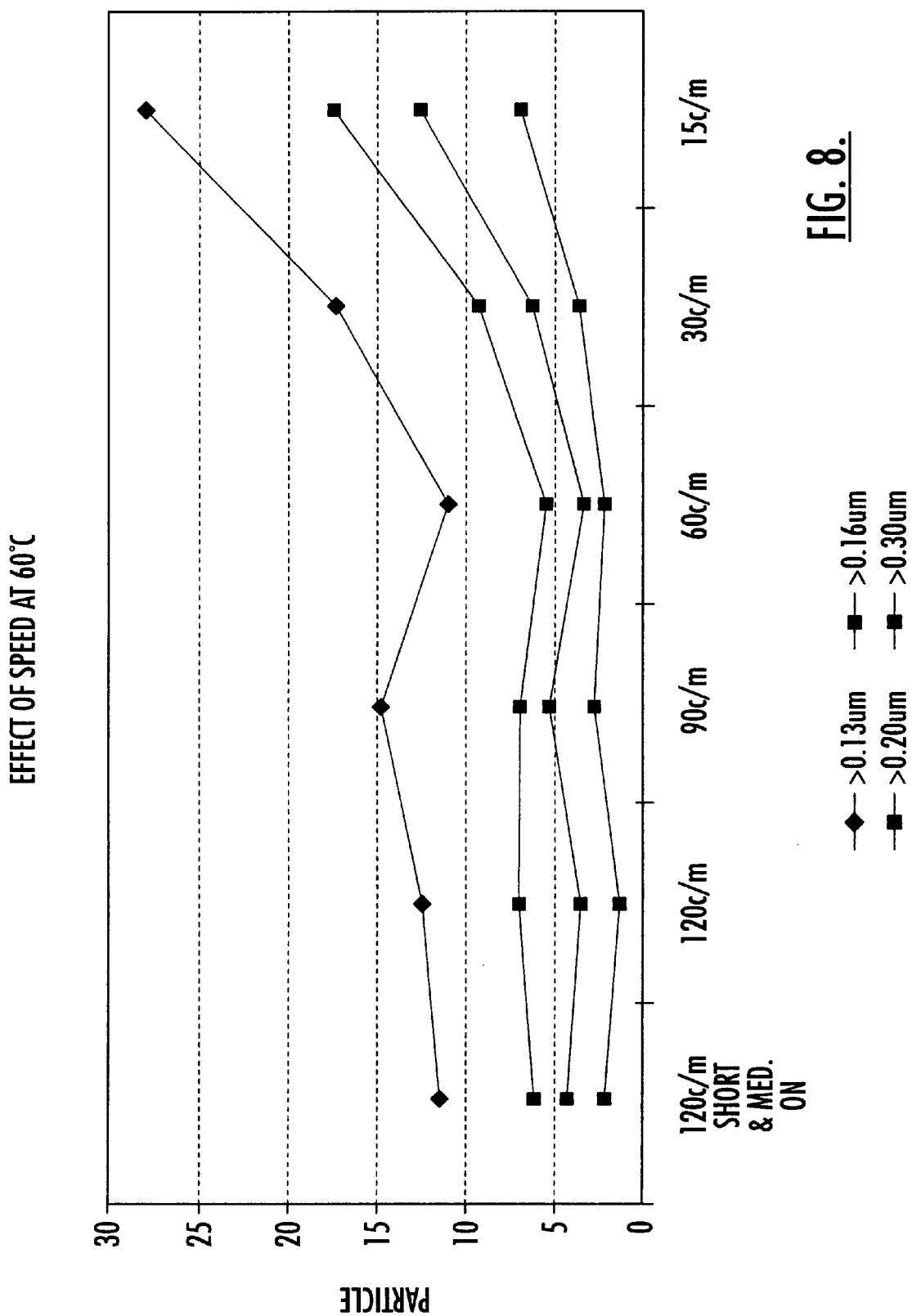
FIG. 8 is a diagrammatic plot showing the relationship between lifting rate and particles.

Referring to FIGS. 8 and 9, the relationship between lifting rate and the particle frequency and size is demonstrated by test data and plot-curves. Note that the first data point includes both the short-wavelength and medium-wavelength IR lights. The remaining pull speeds (at a constant temperature of 60° C.) use only medium-wavelength IR light. In the test, particle sizes of 0.13 $\mu$m, 0.16 $\mu$m, 0.20 $\mu$m and 0.30 $\mu$m are measured. The test results indicate that the lifting rates are inversely related to particle frequency and size.

Figure 10:
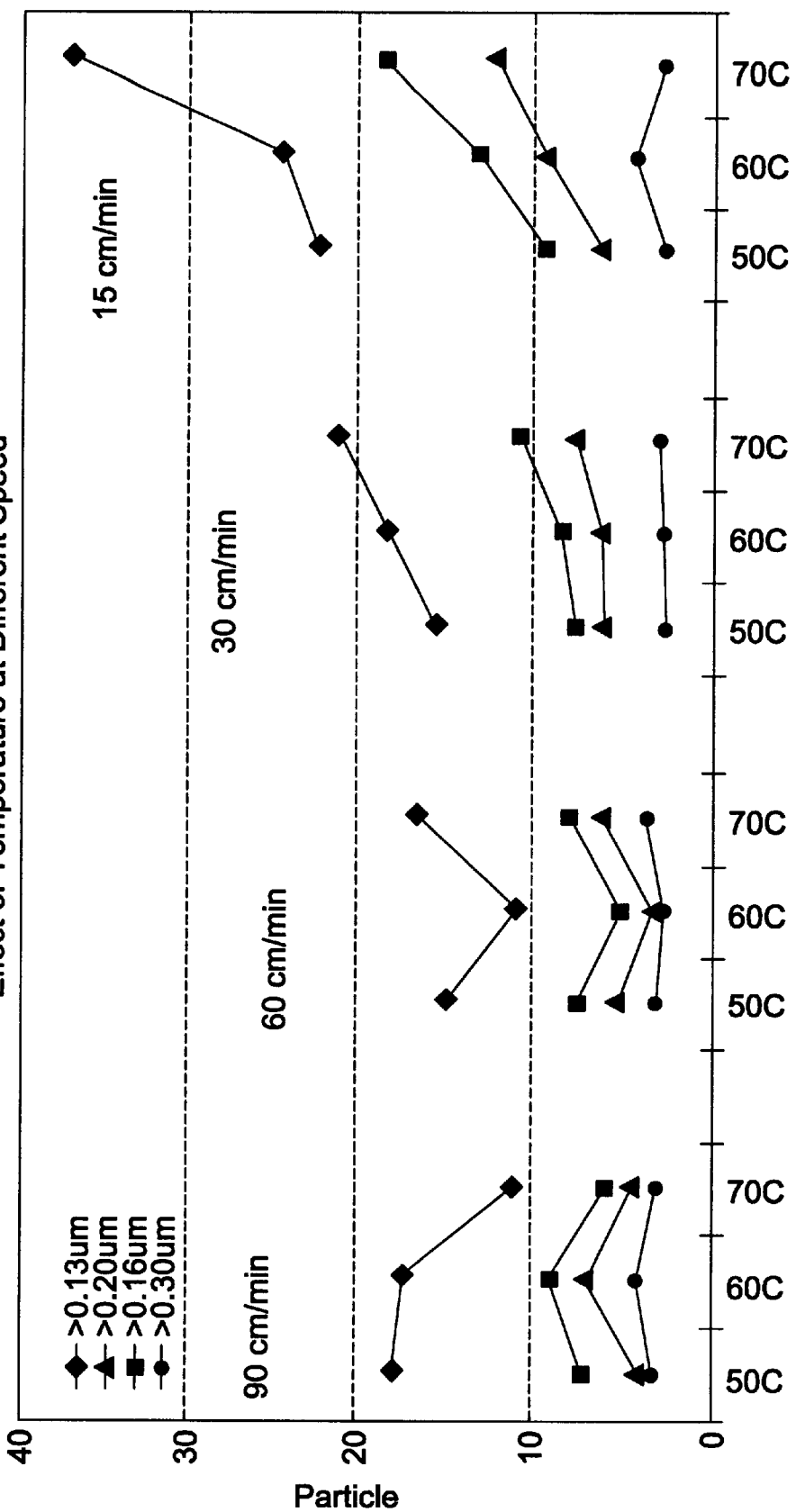
FIG. 10 is a diagrammatic plot showing the relationship of DI water temperature and lifting rate.

Referring to FIGS. 10 and 11, the relationship of DI water temperature to lifting rate is demonstrated by test data and plot-curves. The test results indicate that a lifting rate of up to 90 cm/min can provide low particle levels, with a relatively cooler temperature range of 50 to 70° C.

The present invention provides a number of unexpected advantages. One advantage is the increased productivity that results from elimination of short-wavelength IR. Because use of the short-wavelength IR has been eliminated, processing of individual wafers is replaced by batch processing of up to 25 wafers at a time. A second advantage is the increased productivity due to increasing the pull speed from 10 centimeters per minute to as much as 100 centimeters per minute or more. A third advantage is the elimination of cassettes from the process, thereby improving both productivity and cleanliness.

The present invention may be embodied in other specific forms without departing from its essential characteristics. The described embodiment is to be considered in all respects only as illustrative and not as restrictive. The scope of the invention is, therefore, indicated by the appended claims rather than by the foregoing description. All changes which come within the meaning and range of the equivalence of the claims are to be embraced within their scope.

What is claimed is:

1. A method of drying semiconductor wafers following a chemical cleaning process comprising the steps of:
    (a) maintaining a body of hot deionized water in a bath;
    (b) submerging multiple wafers to be dried in the body of hot deionized water in said bath;
    (c) moving said multiple wafers at a rate between 20 and 120 centimeters per minute up through the surface of the body of hot deionized water in said bath;
    (d) providing an infrared bath containing an infrared lamp; and
    (e) transferring said multiple wafers to said infrared bath for drying.

2. The method of claim 1, wherein said hot deionized water has a temperature range of between about 30° and 70° C.

3. The method of claim 2, wherein said hot deionized water has a temperature range of between about 50° and 70° C.

4. The method of claim 1, wherein said multiple wafers are pulled up at a speed of up to 100 centimeters per minute.

5. The method of claim 1, wherein said infrared bath contains multiple infrared lamps.

6. The method of claim 1, wherein said infrared lamps use medium-wavelength infrared light.

7. The method of claim 6, wherein said medium-wavelength is about 2.6 microns.

8. The method of claim 1, wherein said multiple wafers are separately supported in a vertical position by a wafer rack placed in the bottom of the hot deionized water bath.

9. A method of drying a semiconductor wafer following a chemical cleaning process comprising the steps of:
    treating the wafer with a hot deionized water bath;
    pulling the wafer from the bath at a rate between 20 and 120 centimeters per minute; and
    drying the wafer with a medium-wavelength infrared process.

10. The method of claim 9, wherein the step of treating includes submerging the wafer in a bath of deionized water at 30–70° and the step of drying the wafer uses infrared light having a wavelength of approximately 2.6 microns.

* * * * *